US009685465B2

(12) United States Patent
Chen

(10) Patent No.: US 9,685,465 B2
(45) Date of Patent: Jun. 20, 2017

(54) TFT ARRAY SUBSTRATE

(71) Applicant: Shenzhen China Star Optoelectronics Technology Co., Ltd., Shenzhen, Guangdong (CN)

(72) Inventor: Caiqin Chen, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 122 days.

(21) Appl. No.: 14/423,766

(22) PCT Filed: Nov. 6, 2014

(86) PCT No.: PCT/CN2014/090459
§ 371 (c)(1),
(2) Date: Feb. 25, 2015

(87) PCT Pub. No.: WO2016/061855
PCT Pub. Date: Apr. 28, 2016

(65) Prior Publication Data
US 2016/0268307 A1    Sep. 15, 2016

(30) Foreign Application Priority Data

Oct. 23, 2014  (CN) .......................... 2014 1 0573026

(51) Int. Cl.
*H01L 27/12*    (2006.01)
*G02F 1/1362*    (2006.01)
*G09G 3/36*    (2006.01)

(52) U.S. Cl.
CPC .......... *H01L 27/124* (2013.01); *G02F 1/1362* (2013.01); *G09G 3/3614* (2013.01);
(Continued)

(58) Field of Classification Search
CPC ............... H01L 27/124; H01L 27/1214; H01L 2021/775; H01L 27/00; G02F 1/1362;
(Continued)

(56) References Cited

U.S. PATENT DOCUMENTS

| 2007/0064190 A1* | 3/2007 | Kim ...................... G02F 1/1345 349/142 |
| 2011/0012887 A1* | 1/2011 | Lee ...................... G09G 3/3648 345/212 |
| 2016/0027396 A1* | 1/2016 | Li ........................ G09G 3/3614 345/212 |

FOREIGN PATENT DOCUMENTS

| CN | 103761944 A | 4/2014 |
| KR | 20050065817 A | 6/2005 |

* cited by examiner

*Primary Examiner* — Galina Yushina
(74) *Attorney, Agent, or Firm* — Andrew C. Cheng

(57) ABSTRACT

The present invention provides a TFT array substrate, including a display zone having a plurality of data lines, a plurality of scan lines, and sub-pixels arranged in an array. For the sub-pixels of the same row, a sub-pixel of an even column and a sub-pixel of an odd column that are respectively located at left and right sides of each of the data lines are collectively and electrically connected to the data line each by a TFT. For the sub-pixels of the same row, each of the sub-pixels of the even columns is electrically connected with the scan line above the row of the sub-pixels and each of the sub-pixels of the odd columns is electrically connected with the scan line below the row of the sub-pixels. The non-display zone includes a plurality of fan-out lines. Each of the fan-out lines corresponds to and is connected with one of the scan lines. Each of the fan-out lines includes a horizontal line segment and a slanted line segment. For a skip of every two or four successively arranged scan lines, the slanted line segments of the two fan-out lines respectively corresponding to and connected with two adjacent, (Continued)

upper and lower scan lines are arranged to intersect each other in a mutually isolated manner so as to change the sequence of driving the two adjacent, upper and lower scan lines.

5 Claims, 9 Drawing Sheets

(52) U.S. Cl.
CPC ............... *G09G 2310/0213* (2013.01); *G09G 2320/0233* (2013.01)

(58) Field of Classification Search
CPC ............. G02F 1/134363; G02F 1/1306; G02F 1/133362; G09G 3/3614; G09G 2310/0213; G09G 2320/0233; G09G 3/3266; G09G 3/3674; G09G 2300/0408
See application file for complete search history.

TFT ARRAY SUBSTRATE

BACKGROUND OF THE INVENTION

1. Field of the Invention

The present invention relates to the field of displaying technology, and in particular to a structure of a TFT (Thin-Film Transistor) array substrate.

2. The Related Arts

In the field of displaying technology, flat panel displays, such as liquid crystal displays (LCDs) and organic light-emitting diodes (OLEDs) have gradually taken the place of cathode ray tube (CRT) displays for wide applications in liquid crystal televisions, mobile phones, personal digital assistants (PDAs), digital cameras, computer monitors, and notebook computer screens.

A display panel is a major component of the LCDs and OLEDs. Both the LCD display panels and the OLED display panels comprise a thin-film transistor (TFT) array substrate. The TFT array substrate comprises a plurality of red (R), green (G), and blue (B) sub-pixels arranged in an array and a plurality of scan lines and a plurality of data lines. Each of the sub-pixels receives a scan signal from a corresponding scan line and a data signal from a corresponding data line in order to display an image.

FIG. 1 is a schematic view showing a conventional TFT array substrate. The conventional TFT array substrate comprises a plurality of vertical data lines that is arranged in order and parallel to each other, such as D1, D2, D3, D4, D5 and so on, and a plurality of horizontal scan line that is arranged in order and parallel to each other, such as G1, G2, G3, G4, G5 and so on, and sub-pixels that are arranged in an array. The sub-pixels that are arranged on the same row are each electrically connected via a TFT to the scan line located above the row of sub-pixels. For example, each of the sub-pixels that constitute a first row is electrically connected via a TFT to the scan line G1; each of the sub-pixels that constitute a second row is electrically connected via a TFT to the scan line G2; and so on. The sub-pixels that are arranged on the same column is electrically connected via a TFT to the data line located leftward of the column of sub-pixels. For example, each of the sub-pixels that constitute a first column is electrically connected via a TFT to the data line D1; each of the sub-pixels that constitute a second column is electrically connected via a TFT to the data line D2; and so on.

FIG. 2 is a schematic view showing a conventional data line share (DLS) TFT array substrate. The DLS TFT array substrate comprises data lines each corresponding two columns of sub-pixels and two scan lines respectively arranged above and below each row of sub-pixels. For sub-pixels of each row, a sub-pixel of an even column and a sub-pixel of an odd column that are respectively located on left and right sides of each data line are each electrically connected by a TFT to the data line, namely sharing the same data line. Also, for sub-pixels of each row, each of the sub-pixels of even columns is electrically connected by a TFT to the scan line above the row of the sub-pixels and each of the sub-pixels of odd columns is electrically connected by a TFT to the scan line below the row of the sub-pixels. For example, a second column and a third column of sub-pixels share the data line D2; a fourth column and a fifth column of sub-pixels share data line D3, and so on. Each of the sub-pixels of the first row that are in even columns is electrically connected by a TFT to the scan line G1 above the first row of sub-pixels and each of the sub-pixels of the first row that are in odd columns is electrically connected by a TFT to the scan line G2 below the first row of sub-pixels; each of the sub-pixels of the second row that are in even columns is electrically connected by a TFT to the scan line G3 above the second row of sub-pixels and each of the sub-pixels of the second row that are in odd columns is electrically connected by a TFT to the scan line G4 below the second row of sub-pixels, and so on. Compared to the traditional TFT array substrate shown in FIG. 1, the DLS TFT array substrate allows for reduction of the number of data lines by half and thus reduction of the cost; however, the number of scan lines is doubled so that the charging time that each sub-pixel may have is reduced by half due to the doubled number of scan lines and thus delays of signals in the corresponding data lines and scan lines would be more prominent. For example, at a tail end of a data line (or a scan line), the delay in the data line (or the scan line) could cause difference in charging rates between sub-pixels of the odd row and the sub-pixel of the even rows, and consequently, display defects of vertical bright and dark lines may result.

Specifically, reference is now made collectively to FIGS. 2, 3, and 4. As shown in FIG. 4, the manner of driving data lines is that polarity is reversed for every two dots. Due to RC delay, the data signals are not ideal square waves and the wave forms of the actual signals are wave forms with curved edges as shown in FIG. 3. For a specific sub-pixel Pxy, where x indicates the x-th row and y indicates the y-th column, such as sub-pixel P12 shown in FIG. 2 indicating a sub-pixel of the second column in the first row, when scan lines G1, G2, G3, G4, and so on are sequentially conducted on, the even-column sub-pixels would be sequentially driven earlier than the odd-column sub-pixels that are connected to the same data lines. For example, sub-pixels P12, P13, P22, P23 that are connected to the data line D2 are driven in that sequence. In the period of the same polarity of the data signal, the sub-pixel that is driven later is better charged than that driven earlier. As such, P13 is better charged than P12 and P23 is better charged than P22. After the reverse of polarity of the data signal, the driving sequence maintains the same, namely the even-column sub-pixels are driven first and then the odd-column sub-pixels are driven. As such, the even-column sub-pixels that are driven first may suffer being insufficiently charged so that the site corresponding to the even-column sub-pixels become insufficiently bright, making the overall displaying effect showing a defect of vertical bright and dark lines.

SUMMARY OF THE INVENTION

An object of the present invention is to provide a structure of a thin-film transistor (TFT) array substrate, wherein within the displaying period of the same frame of image, the sub-pixels having irregularity in respect of being relatively bright and relatively dark are arranged in an alternate form spatially so as to improve displaying defects of vertical bright and dark lines and increase aperture ratio.

To achieve the above object, the present invention provides a TFT array substrate, which comprises a display zone and a non-display zone. The display zone comprises a plurality of vertical data lines that are parallel to each other and are successively arranged, a plurality of horizontal scan lines that are parallel to each other and are successively arranged, and sub-pixels that are arranged in an array;

wherein in each of rows of the sub-pixels, a sub-pixel of an even column and a sub-pixel of an odd column that are respectively located on left and right sides of a corresponding data line are collectively and electrically connected to this data line, and the electrical connection of each sub-pixel to the corresponding data line is provided by a sub-pixel TFT;

wherein two scan lines are respectively set above and below each of the rows of the sub-pixel; in the same row of sub-pixels, each of the sub-pixels of even columns is electrically connected by a sub-pixel TFT to the scan line set above the row of sub-pixels and each of the sub-pixels of odd columns is electrically connected to the scan line set below the row of the sub-pixels;

wherein the non-display zone comprises a plurality of fan-out lines, each of the fan-out lines corresponding to and connected with one of the scan lines, each of the fan-out lines comprising a horizontal line segment parallel to the corresponding one of the scan lines and a slanted line segment connecting between the horizontal line segment and the corresponding scan line;

wherein for every second or fourth row of sub-pixels, slanted line segments of two fan-out lines connected to upper and lower scan lines of the second or fourth sub-pixel row are arranged to intersect each other in a mutually isolated manner, while fan-out lines corresponding to any other sub-pixels row do not intersect with each other;

The scan lines and the fan-out lines are connected such that the slanted horizontal line segments of a first pair of two adjacent fan-out lines are respectively corresponding to and connected by the slanted line segments to two corresponding scan lines respectively set above and below the same row of sub-pixels and the connections are such that the slanted line segments of the first pair are arranged to intersect each other in a mutually isolated manner while the slanted line segments of a second pair of two adjacent fan-out lines that is next to the first pair do not intersect each other.

The slanted line segments of the two fan-out lines respectively corresponding to and connected with two scan lines respectively set above and below each of even rows of the sub-pixels are arranged to intersect each other in a mutually isolated manner.

The slanted line segments of the two fan-out lines respectively corresponding to and connected with two scan lines respectively set above and below each of odd rows of the sub-pixels are arranged to intersect each other in a mutually isolated manner.

The scan lines and the fan-out lines are connected such that the horizontal line segments of a first pair of two adjacent fan-out lines are respectively corresponding to and connected by the slanted line segments to two corresponding scan lines respectively set above and below the same row of sub-pixels and the connections are such that the slanted line segments of the first pair are arranged to intersect each other in a mutually isolated manner while the slanted line segments of a second pair of two adjacent fan-out lines that is next to the first pair do not intersect each other and the slanted line segments of a third pair of two adjacent fan-out lines that is next to the second pair do not intersect each other.

The scan lines and the fan-out lines are connected such that the horizontal line segments of a first pair of two adjacent fan-out lines that are respectively corresponding to and connected by the slanted line segments to two scan lines that are respectively set below an upper row of sub-pixels and above a lower row of sub-pixels and the connections are such that the slanted line segments of the first pair are arranged to intersect each other in a mutually isolated manner while the slanted line segments of a second pair of two adjacent fan-out lines that is next to the first pair do not intersect each other.

The scan lines and the fan-out lines are connected such that the horizontal line segments of a first pair of two adjacent fan-out lines that are respectively corresponding to and connected by the slanted line segments to two scan lines that are respectively set below an upper row of sub-pixels and above a lower row of sub-pixels and the connections are such that the slanted line segments of the first pair are arranged to intersect each other in a mutually isolated manner while the slanted line segments of a second pair of two adjacent fan-out lines that is next to the first pair do not intersect each other and the slanted line segments of a third pair of two adjacent fan-out lines that is next to the second pair do not intersect each other.

The data lines are driven in a manner of being subjected to reverse of polarity for every two dots.

The efficacy of the present invention is that the present invention provides a TFT array substrate, wherein for every other pair or for every other three pairs of successively arranged scan lines, the slanted line segments of the two fan-out lines respectively corresponding to and connected with two adjacent, upper and lower scan lines are arranged to intersect each other in a mutually isolated manner, while the slanted line segments associated with the other pairs of scan lines do not intersect each other, so as to change the sequence of driving the two adjacent, upper and lower scan lines, whereby within the displaying period of the same frame of image, the sub-pixels having irregularity in respect of being relatively bright and relatively dark are arranged in an alternate form spatially so as to improve displaying defects of vertical bright and dark lines and increase aperture ratio.

BRIEF DESCRIPTION OF THE DRAWINGS

The technical solution, as well as other beneficial advantages, of the present invention will become apparent from the following detailed description of an embodiment of the present invention, with reference to the attached drawings.

In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
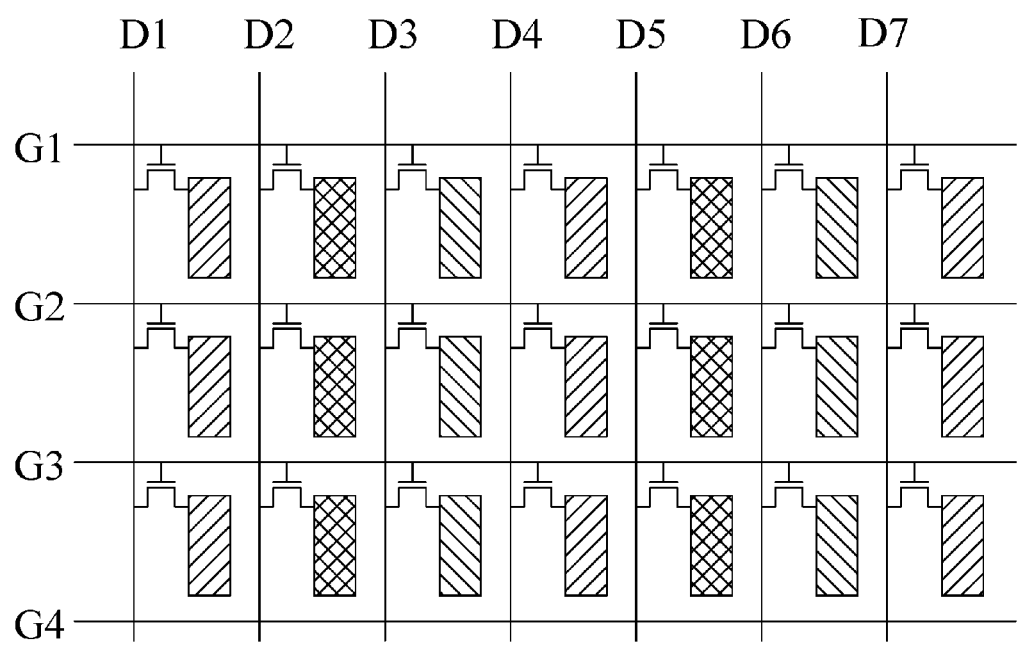
FIG. 1 is a schematic view showing a structure of a conventional thin-film transistor (TFT) array substrate.
Figure 2:
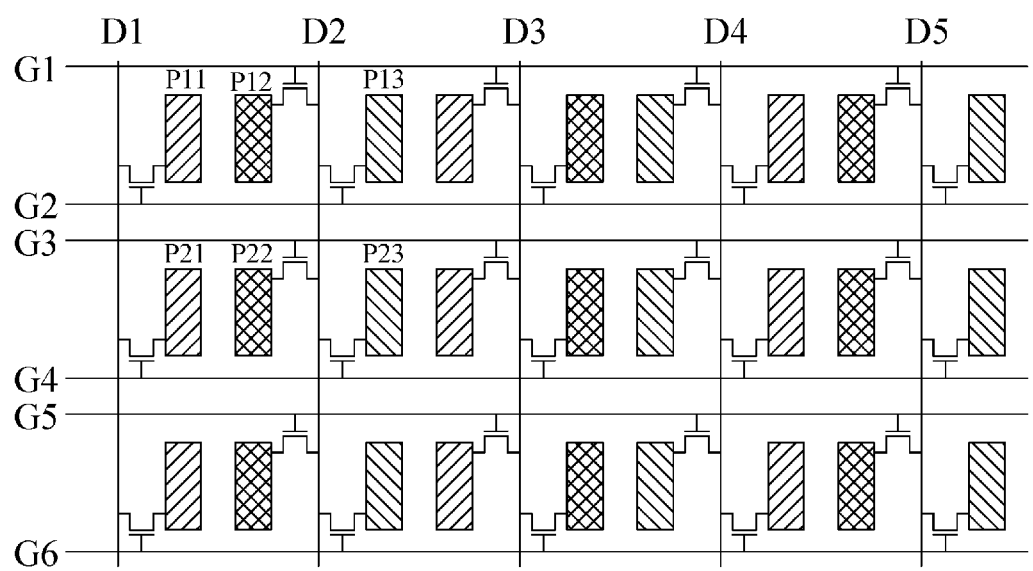
FIG. 2 is a schematic view showing a structure of a conventional data line share (DLS) TFT array substrate.
Figure 3:
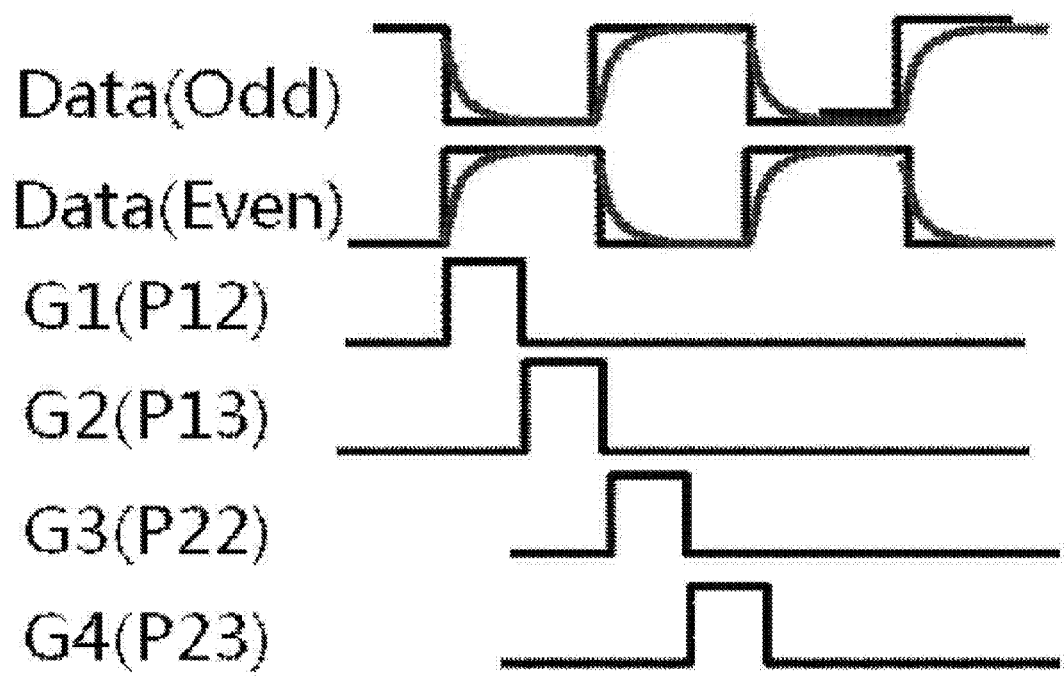
FIG. 3 is a view illustrating wave forms of data signals of FIG. 2.
Figure 4:
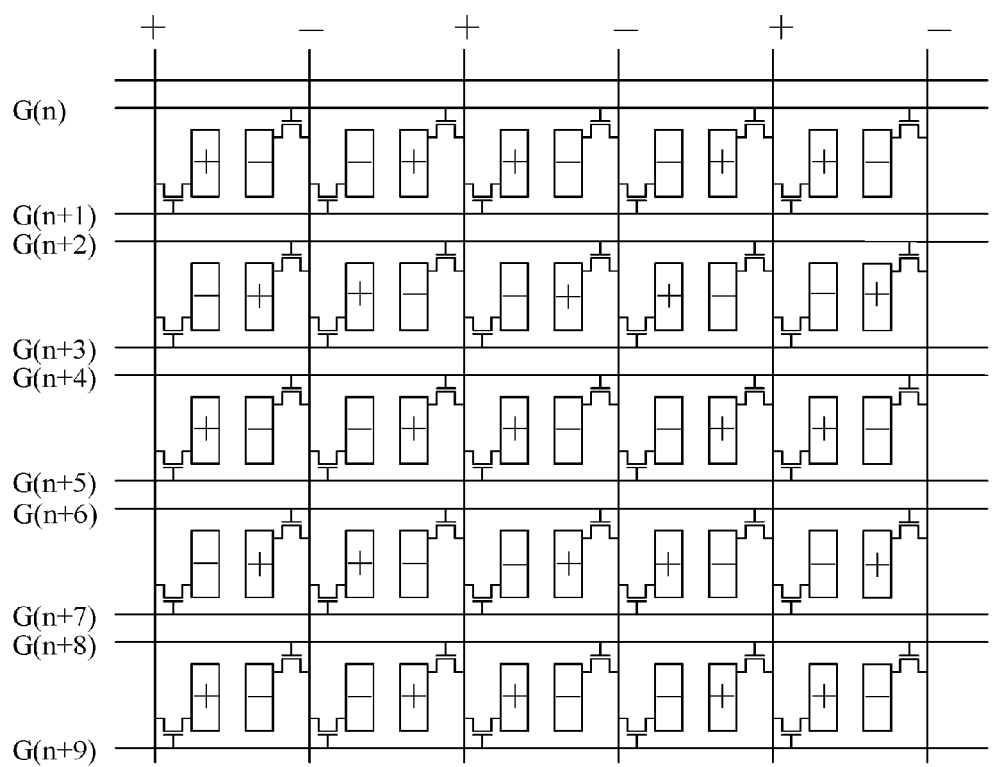
FIG. 4 is a schematic view illustrating two dots polarity reverse for a data line driving method of the DLS TFT array substrate.
Figure 5:
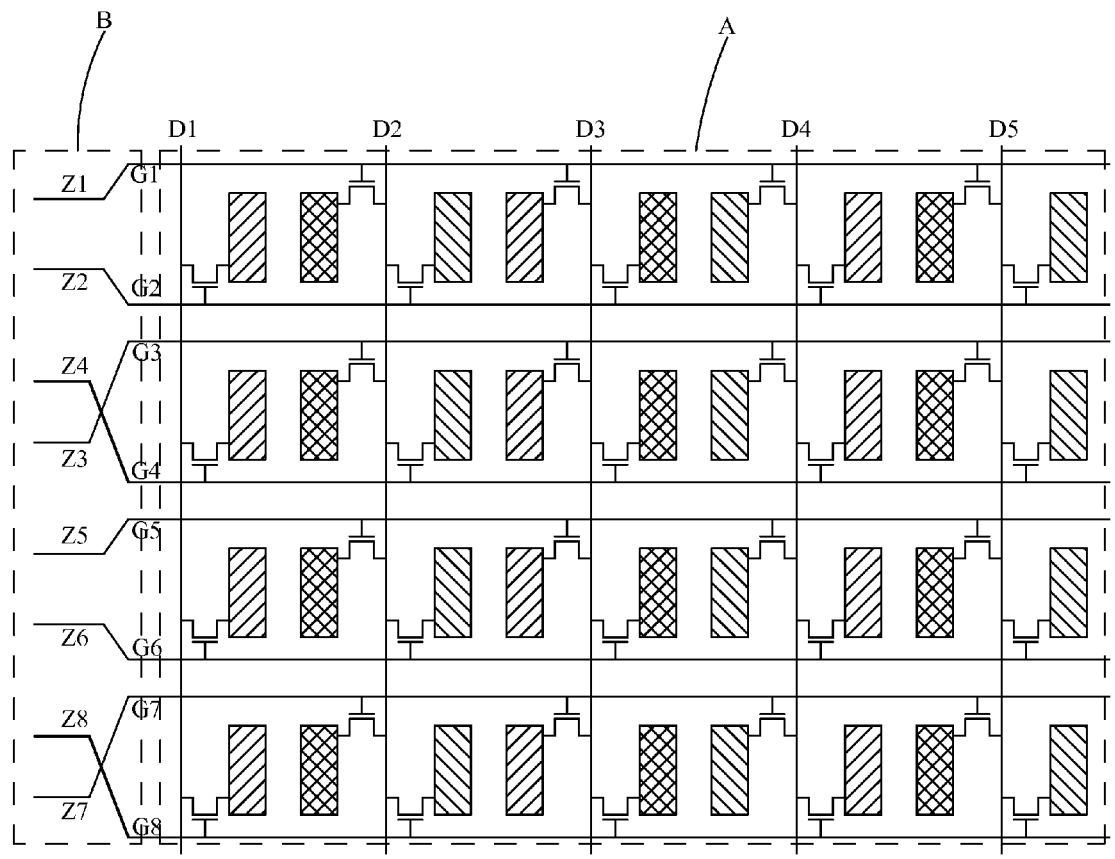
FIG. 5 is a schematic view showing a structure of a TFT array substrate according to a first embodiment of the present invention.

Referring to FIG. 5, a schematic view is given to illustrate a structure of a thin-film transistor (TFT) array substrate according to a first embodiment of the present invention. The TFT array substrate comprises a display zone A and a non-display zone B. The display zone A comprises a plurality of vertical data lines parallel to each other and successively arranged, such as D1, D2, D3, D4, and D5, a plurality of horizontal scan lines parallel to each other and successively arranged, such as G1, G2, G3, G4, G5, G6, G7, and G8, and sub-pixels that are arranged in an array.

In each of rows of the sub-pixels, a sub-pixel of an even column and a sub-pixel of an odd column that are respectively located on left and right sides of each of the data lines are collectively and electrically connected to the data line each by a TFT, namely sharing the data line. For example, in a first row of the sub-pixels, a sub-pixel of a second column and a sub-pixel of a third column that are respectively located at the left and right sides of the data line D2 share the data line D2.

Two scan lines are respectively set above and below each row of the sub-pixels. For example, for the first row of the sub-pixels, scan line G1 is set thereabove and scan line G2 is set therebelow; for the second row of the sub-pixels, scan line G3 is set thereabove and scan line G4 is set therebelow. In the same row of sub-pixels, each of the sub-pixels of even columns is electrically connected by a TFT to the scan line set above the row of sub-pixels and each of the sub-pixels of odd columns is electrically connected to the scan line set below the row of the sub-pixels. For example, in the first row of sub-pixels, each of the sub-pixels of the even columns is electrically connected to scan line G1 and each of the sub-pixels of the odd columns is electrically connected to scan line G2; and in the second row of sub-pixels, each of the sub-pixels of the even columns is electrically connected to scan line G3 and each of the sub-pixels of the odd columns is electrically connected to scan line G4.

The non-display zone B comprises a plurality of fan-out lines, such as Z1, Z2, Z3, Z4, Z5, Z6, Z7, and Z8. Each of the fan-out lines corresponds to and is connected with one of the scan lines. In other words, fan-out line Z1 corresponds to and is connected with scan line G1; the fan-out lines Z2 corresponds to and is connected with scan line G2, and so on. Each of the fan-out lines comprises a horizontal line segment parallel to the corresponding one of the scan lines and a slanted line segment connecting between the horizontal line segment and the corresponding scan line.

The essence of the present invention is that for a skip of two or four successively arranged scan lines, the slanted line segments of the two fan-out lines respectively corresponding to and connected with two adjacent, upper and lower scan lines are arranged to intersect each other in a mutually isolated manner so as to change the sequence of driving the two adjacent, upper and lower scan lines.

In the first embodiment, for a skip of every two successively arranged scan lines, the slanted line segments of the two fan-out lines respectively corresponding to and connected with the two scan lines that are respectively set above and below each even row of the sub-pixels are arranged to intersect each other in a mutually isolated manner. For example, with a skip of scan lines G1, G2, the slanted line segments of the two fan-out lines Z3, Z4 respectively corresponding to and connected with the two scan lines, G3, G4 that are respectively set above and below the second row of the sub-pixels are arranged to intersect each other so that the horizontal line segment of fan-out line Z4 is located above the horizontal line segment of fan-out line Z3; with a skip of scan lines G5, G6, the slanted line segments of the two fan-out lines Z7, Z8 respectively corresponding to and connected with the two scan lines, G7, G8 that are respectively set above and below the fourth row of the sub-pixels are arranged to intersect each other so that the horizontal line segment of fan-out line Z8 is located above the horizontal line segment of fan-out line Z7.

In displaying an image, for the displaying period of the same frame of the image, the sequence of driving of the two scan lines above and below each even row of the sub-pixels is changed due to the slanted line segments of the two corresponding fan-out lines being arranged to intersect each other in a mutually isolated manner and thus, scan lines G1, G2, G4, G3, G5, G6, G8, G7 are driven in that sequence so that the sub-pixels of the even columns in each odd row of the sub-pixels are driven first and the sub-pixels of the odd columns are driven later; and the sub-pixels of the odd columns in each even row of the sub-pixels are driven first and the sub-pixels of the even columns are driven later, whereby the sub-pixels of the odd columns in each odd row of the sub-pixels are brighter, while the sub-pixels of the even columns are darker; and the sub-pixels of the odd columns of each even row of the sub-pixels are darker, while the sub-pixels of the even columns are brighter. The driving process of the data lines is subjected to polarity reverse for every two dots and after the reverse of the polarity of the data signal, the driving sequence is not changed so that eventually, bright and dark sub-pixels of each column of the sub-pixels are alternate with each other, making it visually imperceptive of the difference between bright and dark ones and also preventing the TFTs of two rows of sub-pixels from being vertically adjacent to each other to thereby increase the aperture ratio.

Figure 6:
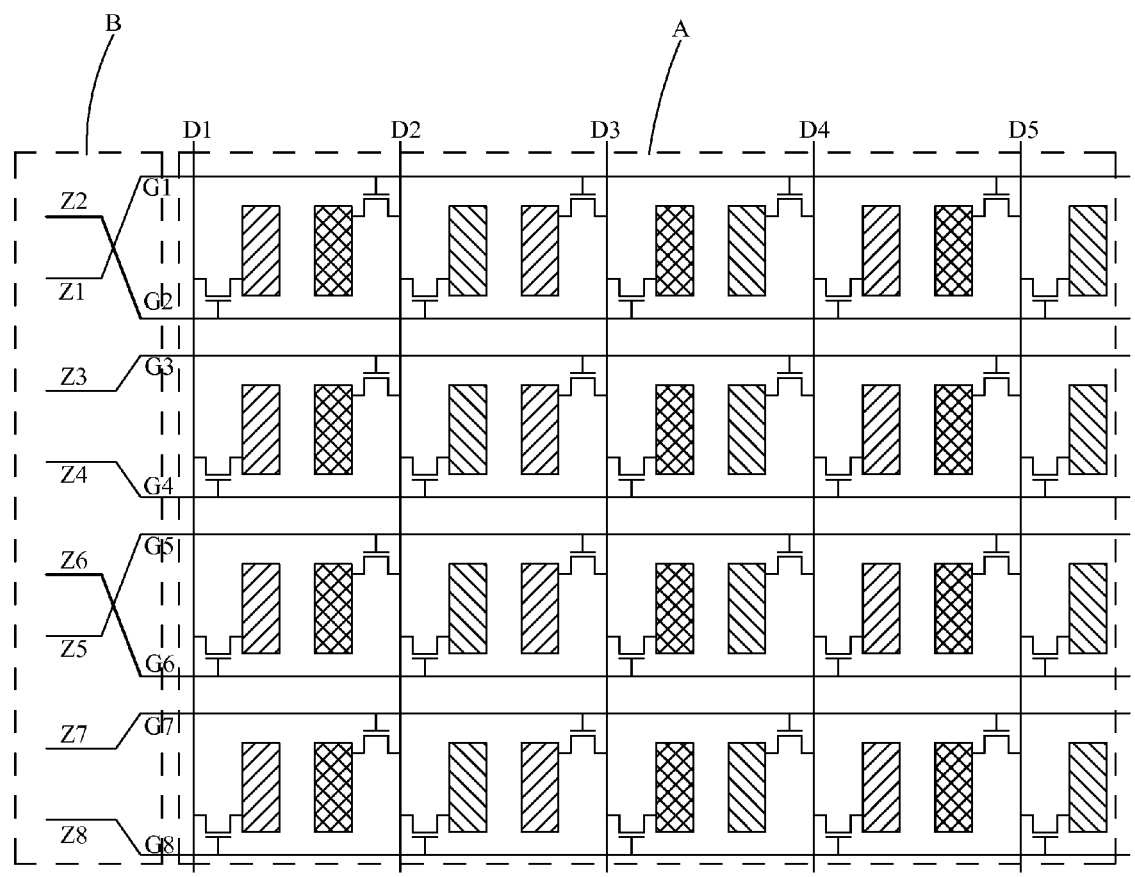
FIG. 6 is a schematic view showing a structure of a TFT array substrate according to a second embodiment of the present invention.

FIG. 6 shows a TFT array substrate according to a second embodiment of the present invention. In the second embodiment, for a skip of every two successively arranged scan lines, the slanted line segments of the two fan-out lines respectively corresponding to and connected with the two scan lines that are respectively set above and below each odd row of the sub-pixels are arranged to intersect each other in a mutually isolated manner. For example, the slanted line segments of the two fan-out lines Z1, Z2 respectively corresponding to and connected with the two scan lines, G1, G2 that are respectively set above and below the first row of the sub-pixels are arranged to intersect each other so that the horizontal line segment of fan-out line Z2 is located above the horizontal line segment of fan-out line Z1; with a skip of scan lines G3, G4, the slanted line segments of the two fan-out lines Z5, Z6 respectively corresponding to and connected with the two scan lines, G5, G6 that are respectively set above and below the third row of the sub-pixels are arranged to intersect each other so that the horizontal line segment of fan-out line Z6 is located above the horizontal line segment of fan-out line Z5.

In displaying an image, for the displaying period of the same frame of the image, the sequence of driving of the two scan lines above and below each odd row of the sub-pixels is changed due to the slanted line segments of the two corresponding fan-out lines being arranged to intersect each other in a mutually isolated manner and thus, scan lines G2, G1, G3, G4, G6, G5, G7, G8 are driven in that sequence so that the sub-pixels of the odd columns in each odd row of the sub-pixels are driven first and the sub-pixels of the even columns are driven later; and the sub-pixels of the even columns in each even row of the sub-pixels are driven first and the sub-pixels of the odd columns are driven later, whereby the sub-pixels of the odd columns in each odd row of the sub-pixels are darker, while the sub-pixels of the even columns are brighter; and the sub-pixels of the odd columns of each even row of the sub-pixels are brighter, while the sub-pixels of the even columns are darker. The driving process of the data lines is subjected to polarity reverse for every two dots and after the reverse of the polarity of the data signal, the driving sequence is not changed so that eventually, bright and dark sub-pixels of each column of the sub-pixels are alternate with each other, making it visually imperceptive of the difference between bright and dark ones and also preventing the TFTs of two rows of sub-pixels from being vertically adjacent to each other to thereby increase the aperture ratio.

The remaining is similar to that of the first embodiment so that repeated description is omitted herein.

Figure 7:
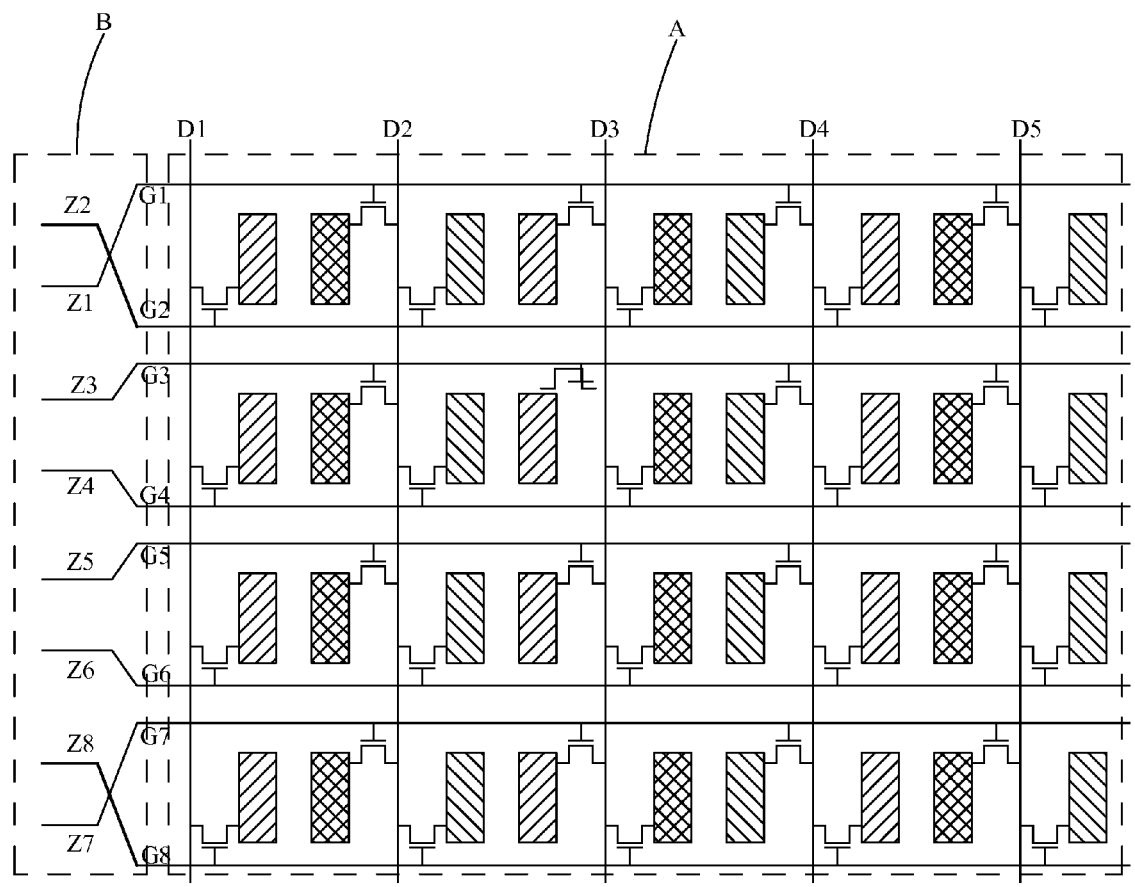
FIG. 7 is a schematic view showing a structure of a TFT array substrate according to a third embodiment of the present invention.

FIG. 7 shows a TFT array substrate according to a third embodiment of the present invention. In the third embodiment, for a skip of every four successively arranged scan lines, the slanted line segments of the two fan-out lines respectively corresponding to and connected with the two scan lines that are respectively set above and below the same row of sub-pixels are arranged to intersect each other in a mutually isolated manner. For example, the slanted line segments of the two fan-out lines Z1, Z2 respectively corresponding to and connected with the two scan lines, G1, G2 that are respectively set above and below the first row of the sub-pixels are arranged to intersect each other so that the horizontal line segment of fan-out line Z2 is located above the horizontal line segment of fan-out line Z1; with a skip of scan lines G3, G4, G5, G6, the slanted line segments of the two fan-out lines Z7, Z8 respectively corresponding to and connected with the two scan lines, G7, G8 that are respectively set above and below the fourth row of the sub-pixels are arranged to intersect each other so that the horizontal line segment of fan-out line Z8 is located above the horizontal line segment of fan-out line Z7 so as to change the sequence of driving for scan lines G7, G8.

In displaying an image, scan lines G2, G1, G3, G4, G5, G6, G8, G7 are driven in that sequence so that the sub-pixels of the odd columns in the first row and the fourth row of the sub-pixels are driven first and the sub-pixels of the even columns are driven later; and the sub-pixels of the even columns in the second row and the third row of the sub-pixels are driven first and the sub-pixels of the odd columns are driven later, whereby the sub-pixels of the odd columns in the first row and the fourth row of the sub-pixels are darker, while the sub-pixels of the even columns are brighter; and the sub-pixels of the odd columns of the second row and the third row of the sub-pixels are brighter, while the sub-pixels of the even columns are darker. The driving process of the data lines is subjected to polarity reverse for every two dots and after the reverse of the polarity of the data signal, the driving sequence is not changed. As such, eventually, bright and dark sub-pixels of each column of the sub-pixels are alternate with each other, making it visually imperceptive of the difference between bright and dark ones and also preventing the TFTs of two rows of sub-pixels from being vertically adjacent to each other to thereby increase the aperture ratio.

The remaining is similar to that of the first embodiment so that repeated description is omitted herein.

Figure 8:
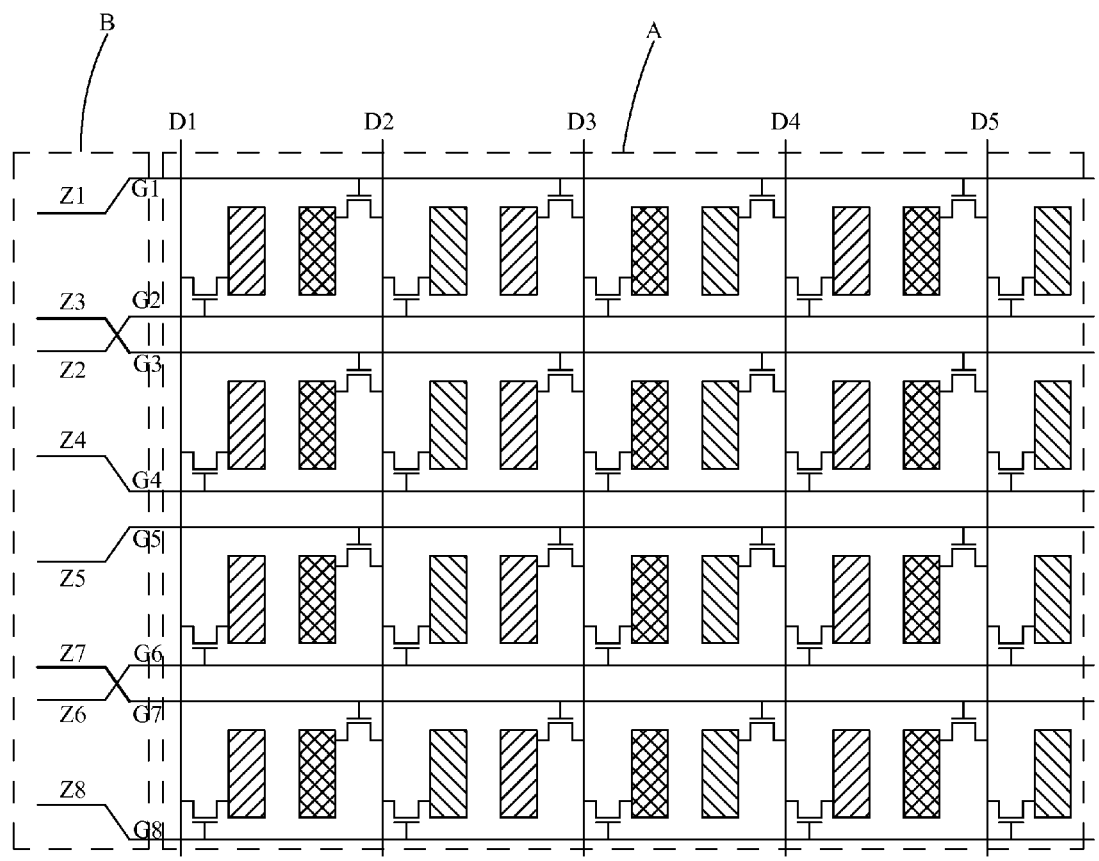
FIG. 8 is a schematic view showing a structure of a TFT array substrate according to a fourth embodiment of the present invention.

FIG. 8 shows a TFT array substrate according to a fourth embodiment of the present invention. In the fourth embodiment, for a skip of every two successively arranged scan lines, between two, upper and lower, adjacent rows of the sub-pixels, the slanted line segments of the two fan-out lines respectively corresponding to and connected with the two scan lines that are respectively set below the upper row of the sub-pixels and above the lower row of the sub-pixels are arranged to intersect each other in a mutually isolated manner. For example, the slanted line segment of the fan-out line Z2 corresponding to and connected with scan line G2 that is set below the first row of the sub-pixels and the slanted line segment of the fan-out line Z3 corresponding to and connected with scan line G3 that is set above the second row of the sub-pixels are arranged to intersect each other so that the horizontal line segment of fan-out line Z3 is located above the horizontal line segment of fan-out line Z2 thereby changing the sequence of driving scan lines G2, G3; with a skip of scan lines Z4, Z5, the slanted line segment of the fan-out lines Z6 corresponding to and connected with the scan line G6 that is set below the third row of the sub-pixels and the slanted line segment of the fan-out line Z7 corresponding to and connected with scan line G7 that is set above the fourth row of the sub-pixels are arranged to intersect each other so that the horizontal line segment of fan-out line Z7 is located above the horizontal line segment of fan-out line Z6 thereby changing the sequence of driving scan lines G6, G7.

In displaying an image, scan lines G1, G3, G2, G4, G5, G7, G6, G8 are driven in that sequence and thus, the sequence of driving of the sub-pixels of the rows is: the sub-pixels of the even columns in the first row of the sub-pixels, the sub-pixels of the even columns in the second row of the sub-pixels, the sub-pixels of the odd columns in the first row of the sub-pixels, the sub-pixels of the odd columns in the second row of the sub-pixels, the sub-pixels of the even columns in the third row of the sub-pixels, the sub-pixels of the even columns in the fourth row of the sub-pixels, the sub-pixels of the odd columns in the third row of the sub-pixels, and the sub-pixels of the odd columns in the fourth row of the sub-pixels, whereby the sub-pixels of the even columns in the first row and the third row of the sub-pixels are darker, while the sub-pixels of the even columns of the second row and the fourth row of the sub-pixels are brighter; and the sub-pixels of the odd columns of the first row and the third row of the sub-pixels are darker, while the sub-pixels of the odd columns of he second row and the fourth row of the sub-pixels are brighter. The driving process of the data lines is subjected to polarity reverse for every two dots and after the reverse of the polarity of the data signal, the driving sequence is not changed. As such, eventually, bright and dark sub-pixels of each column of the sub-pixels are alternate with each other, making it visually imperceptive of the difference between bright and dark ones and also preventing the TFTs of two rows of sub-pixels from being vertically adjacent to each other to thereby increase the aperture ratio.

The remaining is similar to that of the first embodiment so that repeated description is omitted herein.

Figure 9:
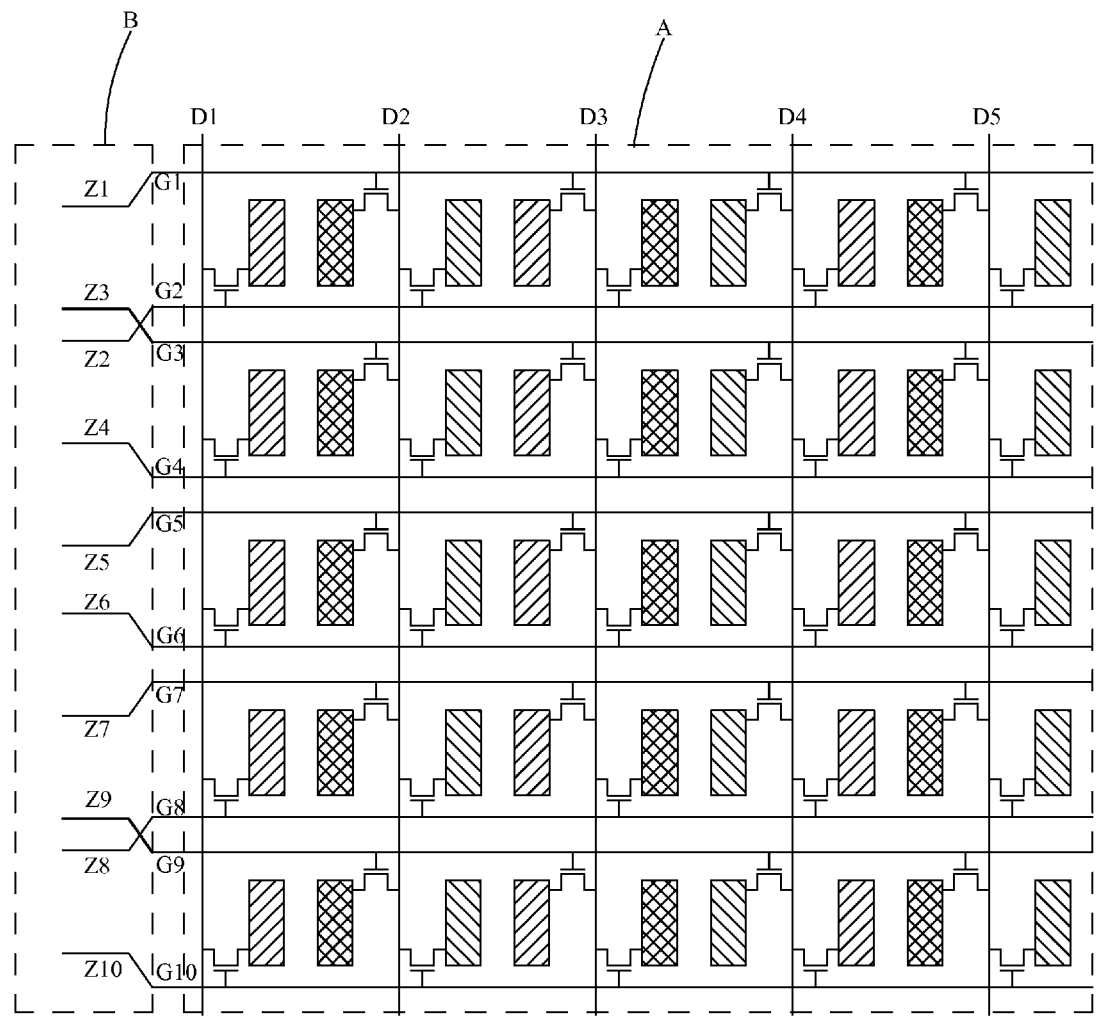
FIG. 9 is a schematic view showing a structure of a TFT array substrate according to a fifth embodiment of the present invention.

FIG. 9 shows a TFT array substrate according to a fifth embodiment of the present invention. In the fifth embodiment, for a skip of every four successively arranged scan lines, between two, upper and lower, adjacent rows of the sub-pixels, the slanted line segments of the two fan-out lines respectively corresponding to and connected with the two scan lines that are respectively set below the upper row of the sub-pixels and above the lower row of the sub-pixels are arranged to intersect each other in a mutually isolated manner. For example, the slanted line segment of the fan-out line Z2 corresponding to and connected with scan line G2 that is set below the first row of the sub-pixels and the slanted line segment of the fan-out line Z3 corresponding to and connected with scan line G3 that is set above the second row of the sub-pixels are arranged to intersect each other so that the horizontal line segment of fan-out line Z3 is located above the horizontal line segment of fan-out line Z2 thereby changing the sequence of driving scan lines G2, G3; with a skip of scan lines Z4, Z5, Z6, Z7, the slanted line segment of the fan-out lines Z8 corresponding to and connected with the scan line G8 that is set below the fourth row of the sub-pixels and the slanted line segment of the fan-out line Z9 corresponding to and connected with scan line G9 that is set above the fifth row of the sub-pixels are arranged to intersect each other so that the horizontal line segment of fan-out line Z9 is located above the horizontal line segment of fan-out line Z8 thereby changing the sequence of driving scan lines G8, G9.

In displaying an image, scan lines G1, G3, G2, G4, G5, G6, G7, G9, G8, G10 are driven in that sequence and thus, the sequence of driving of the sub-pixels of the rows is: the sub-pixels of the even columns in the first row of the sub-pixels, the sub-pixels of the even columns in the second row of the sub-pixels, the sub-pixels of the odd columns in the first row of the sub-pixels, the sub-pixels of the odd columns in the second row of the sub-pixels, the sub-pixels of the even columns in the third row of the sub-pixels, the sub-pixels of the odd columns in the third row of the sub-pixels, the sub-pixels of the even columns in the fourth row of the sub-pixels, the sub-pixels of the even columns in the fifth row of the sub-pixels, the sub-pixels of the odd columns in the fourth row of the sub-pixels, and the sub-pixels of the odd columns in the fifth row of the sub-pixels, whereby the sub-pixels of the even columns in the first row and the fourth row of the sub-pixels are darker, while the sub-pixels of the even columns of the second row and the fifth row of the sub-pixels are brighter; and the sub-pixels of the odd columns of the first row and the fourth row of the sub-pixels are darker, while the sub-pixels of the odd columns of he second row and the fifth row of the sub-pixels are brighter. The driving process of the data lines is subjected to polarity reverse for every two dots and after the reverse of the polarity of the data signal, the driving sequence is not changed. As such, eventually, bright and dark sub-pixels of each column of the sub-pixels are alternate with each other, making it visually imperceptive of the difference between bright and dark ones and also preventing the TFTs of two rows of sub-pixels from being vertically adjacent to each other to thereby increase the aperture ratio.

The remaining is similar to that of the first embodiment so that repeated description is omitted herein.

In summary, the present invention provides a TFT array substrate, wherein for a skip of every two or four successively arranged scan lines, the slanted line segments of the two fan-out lines respectively corresponding to and connected with two adjacent, upper and lower scan lines are arranged to intersect each other in a mutually isolated manner so as to change the sequence of driving the two adjacent, upper and lower scan lines, whereby within the displaying period of the same frame of image, the sub-pixels having irregularity in respect of being relatively bright and relatively dark are arranged in an alternate form spatially so as to improve displaying defects of vertical bright and dark lines and increase aperture ratio.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A thin-film transistor (TFT) array substrate, comprising a display zone and a non-display zone, the display zone comprising a plurality of vertical data lines that are parallel to each other and are successively arranged, a plurality of horizontal scan lines that are parallel to each other and are successively arranged, and sub-pixels that are arranged in an array;
wherein in each of rows of the sub-pixels, a sub-pixel of an even column and a sub-pixel of an odd column that are respectively located on left and right sides of a corresponding data line are collectively and electrically connected to this data line, and the electrical connection of each sub-pixel to the corresponding data line is provided by a sub-pixel TFT;
wherein two scan lines are respectively set above and below each of the rows of the sub-pixel; in the same row of sub-pixels, each of the sub-pixels of even columns is electrically connected by a sub-pixel TFT to the scan line set above the row of sub-pixels and each of the sub-pixels of odd columns is electrically connected to the scan line set below the row of the sub-pixels;
wherein the non-display zone comprises a plurality of fan-out lines, each of the fan-out lines corresponding to and connected with one of the scan lines, each of the fan-out lines comprising a horizontal line segment parallel to the corresponding one of the scan lines and a slanted line segment connecting between the horizontal line segment and the corresponding scan line;
wherein for every second or fourth row of sub-pixels, slanted line segments of two fan-out lines connected to upper and lower scan lines of the second or fourth sub-pixel row are arranged to intersect each other in a mutually isolated manner while fan-out lines corresponding to any other sub-pixels row do not intersect with each other.

2. The TFT array substrate as claimed in claim 1, wherein the slanted line segments of the two fan-out lines respectively corresponding to and connected with two scan lines respectively set above and below each of even rows of the sub-pixels are arranged to intersect each other in a mutually isolated manner.

3. The TFT array substrate as claimed in claim 1, wherein the slanted line segments of the two fan-out lines respectively corresponding to and connected with two scan lines respectively set above and below each of odd rows of the sub-pixel are arranged to intersect each other in a mutually isolated manner.

4. The TFT array substrate as claimed in claim 1, wherein the data lines are driven in a manner of being subjected to reverse of polarity for every two dots.

5. A thin-film transistor (TFT) array substrate, comprising a display zone and a non-display zone, the display zone comprising a plurality of vertical data lines that are parallel to each other and are successively arranged, a plurality of horizontal scan lines that are parallel to each other and are successively arranged, and sub-pixels that are arranged in an array;
wherein in each of rows of the sub-pixels, a sub-pixel of an even column and a sub-pixel of an odd column that are respectively located on left and right sides of a corresponding data line are collectively and electrically connected to this data line, and the electrical connection of each sub-pixel to the corresponding data line is provided by a sub-pixel TFT;

wherein two scan lines are respectively set above and below each of the rows of the sub-pixel; in the same row of sub-pixels, each of the sub-pixels of even columns is electrically connected by a sub-pixel TFT to the scan line set above the row of sub-pixels and each of the sub-pixels of odd columns is electrically connected to the scan line set below the row of the sub-pixels;

wherein the non-display zone comprises a plurality of fan-out lines, each of the fan-out lines corresponding to and connected with one of the scan lines, each of the fan-out lines comprising a horizontal line segment parallel to the corresponding one of the scan lines and a slanted line segment connecting between the horizontal line segment and the corresponding scan line;

wherein for every second or fourth row of sub-pixels, slanted line segments of two fan-out lines connected to upper and lower scan lines of the second or fourth sub-pixel row are arranged to intersect each other in a mutually isolated manner, while fan-out lines corresponding to any other sub-pixels row do not intersect with each other;

wherein the slanted line segments of the two fan-out lines respectively corresponding to and connected with two scan lines respectively set above and below each of even rows of the sub-pixels are arranged to intersect each other in a mutually isolated manner;

wherein the data lines are driven in a manner of being subjected to reverse of polarity for every two dots.

\* \* \* \* \*